United States Patent
Minzoni et al.

(10) Patent No.: US 7,405,996 B2
(45) Date of Patent: Jul. 29, 2008

(54) SYSTEM AND METHOD TO SYNCHRONIZE SIGNALS IN INDIVIDUAL INTEGRATED CIRCUIT COMPONENTS

(75) Inventors: Alessandro Minzoni, Xi'an (CN); Jonghee Han, Cary, NC (US)

(73) Assignee: Infineon Technologies AG (DE)

( * ) Notice: Subject to any disclaimer, the term of this patent is extended or adjusted under 35 U.S.C. 154(b) by 278 days.

(21) Appl. No.: 11/408,647

(22) Filed: Apr. 21, 2006

(65) Prior Publication Data
US 2007/0247960 A1    Oct. 25, 2007

(51) Int. Cl.
*G11C 8/00* (2006.01)
(52) U.S. Cl. ............ 365/233.1; 365/194; 327/158
(58) Field of Classification Search ............ 365/233.1, 365/194, 225.7; 327/155, 156, 158
See application file for complete search history.

(56) References Cited

U.S. PATENT DOCUMENTS

| | | | |
|---|---|---|---|
| 7,277,357 B1 * | 10/2007 | Ma | 365/233.12 |
| 2006/0255846 A1 * | 11/2006 | Drexler et al. | 327/158 |
| 2007/0086267 A1 * | 4/2007 | Kwak | 365/233 |

* cited by examiner

*Primary Examiner*—Richard T. Elms
*Assistant Examiner*—Toan Le
(74) *Attorney, Agent, or Firm*—Coats & Bennett, P.L.L.C.

(57) ABSTRACT

A synchronous output signal generated by an integrated circuit (IC) component is synchronized to an applied clock signal for each individual IC component. A variable feedback delay in the IC component is incrementally altered to alter the phase skew between the clock signal and the output signal. The relative phase order of the clock and output signals is monitored in the IC component. In response to detecting a swap in the relative phase order of the clock and output signals, the variable feedback delay ceases to be altered. In some embodiments, the IC component may be a SDRAM component.

27 Claims, 5 Drawing Sheets

SYSTEM AND METHOD TO SYNCHRONIZE SIGNALS IN INDIVIDUAL INTEGRATED CIRCUIT COMPONENTS

BACKGROUND

The present invention relates generally to the field of integrated circuits and in particular to a system and method to synchronize an output signal generated by a integrated circuit component to an applied clock signal.

Synchronous logic refers to a wide array of analog and digital circuits wherein state—the collective contents of storage locations and the conditions of input and output signals—changes in temporal synchronicity with an applied periodic signal, known in the art as a clock signal. Particularly in systems comprising a plurality of interconnected integrated circuits, synchronizing the state transition of certain output signals to an applied clock input is important to reduce clock skew and achieve reliable high frequency operation. One example of a synchronous integrated circuit component commonly interconnected to other high-frequency, synchronous circuits is SDRAM memory.

A Synchronous Dynamic Random Access Memory (SDRAM) component is a high-density, solid-state, volatile, digital data storage device. As its name implies, a SDRAM differs from a DRAM in that applied control signals, output timing signals, and data bits (in both read and write directions) transition synchronously with an applied clock signal. This feature simplifies the control of the SDRAM by processors, memory controllers, bus interface circuits, and other synchronous, or clocked, circuits, and allows for higher operating frequencies than conventional DRAMs. Tight synchronization with a clock input is even more critical for Double Data Rate (DDR) SDRAM components, which provide data and control signal transitions on both edges of the clock signal.

One example of a synchronous SDRAM signal is a data strobe signal, which is used in at least SDRAM write and read operations. The data strobe signal is provided as an input to the SDRAM when writing data to it, and is used by the SDRAM to latch write data synchronously with the clock signal. Conversely, the data strobe signal is an output generated by the SDRAM when data is read from it, and is used by memory controllers to latch read data synchronously with the clock signal.

During read operations, the SDRAM generates the data strobe signal synchronously with the clock signal. Ideally, the data bits (DQ) and data strobe (DQS) exhibit little or no skew relative to the applied clock signal (CK). The degree to which DQ and DQS diverge from synchronicity with the CK limits high frequency operation, and is specified by SDRAM manufacturers as $t_{AC}$ and $t_{DQSCK}$, respectively. One challenge of SDRAM design, manufacture, and testing is to minimize $t_{AC}$ and $t_{DQSCK}$.

A conventional approach to reducing the skew between synchronous output signals and the clock signal in an integrated circuit is the use of a Delay Locked Loop (DLL). A DLL dynamically adjusts the delay of a variable delay line to reduce the phase skew between a synchronous signal being generated and the clock signal. DLLs reduce skew between on-chip, or internal, signals.

To reduce the skew between corresponding external signals—such as the applied CK input and the DQS output during read operations—it is known to add a trimmable feedback delay to a DLL that accounts for input and output buffer delay. This trimmable delay may be altered during manufacturing testing by monitoring the external signals in a tester and blowing one or more fuses associated with delay elements in the feedback delay circuit until the external signals are phase aligned. Since it consumes valuable testing time, this procedure is performed on a selected number of SDRAM components on a wafer and the resultant values of the feedback delays are averaged. Fuses are then blown on the remaining SDRAM components on the wafer to set the feedback delay of each to this average value.

However, due to process variations, the delays imposed by input and output buffers may vary widely, even among SDRAM components on the same wafer. Consequently, each setting the feedback delay in each SDRAM component to the average value means that the SDRAM components are not individually optimized to minimize the phase skew between synchronous outputs and the clock signal.

SUMMARY

According to one or more embodiments of the present invention, a synchronous output signal generated by an integrated circuit (IC) component is synchronized to an applied clock signal for each individual IC component. A variable feedback delay in the IC component is incrementally altered to alter the phase skew between the clock signal and the output signal. The relative phase order of the clock and output signals is monitored in the IC component. In response to detecting a swap in the relative phase order of the clock and output signals, the variable feedback delay ceases to be altered.

DETAILED DESCRIPTION

Figure 1:
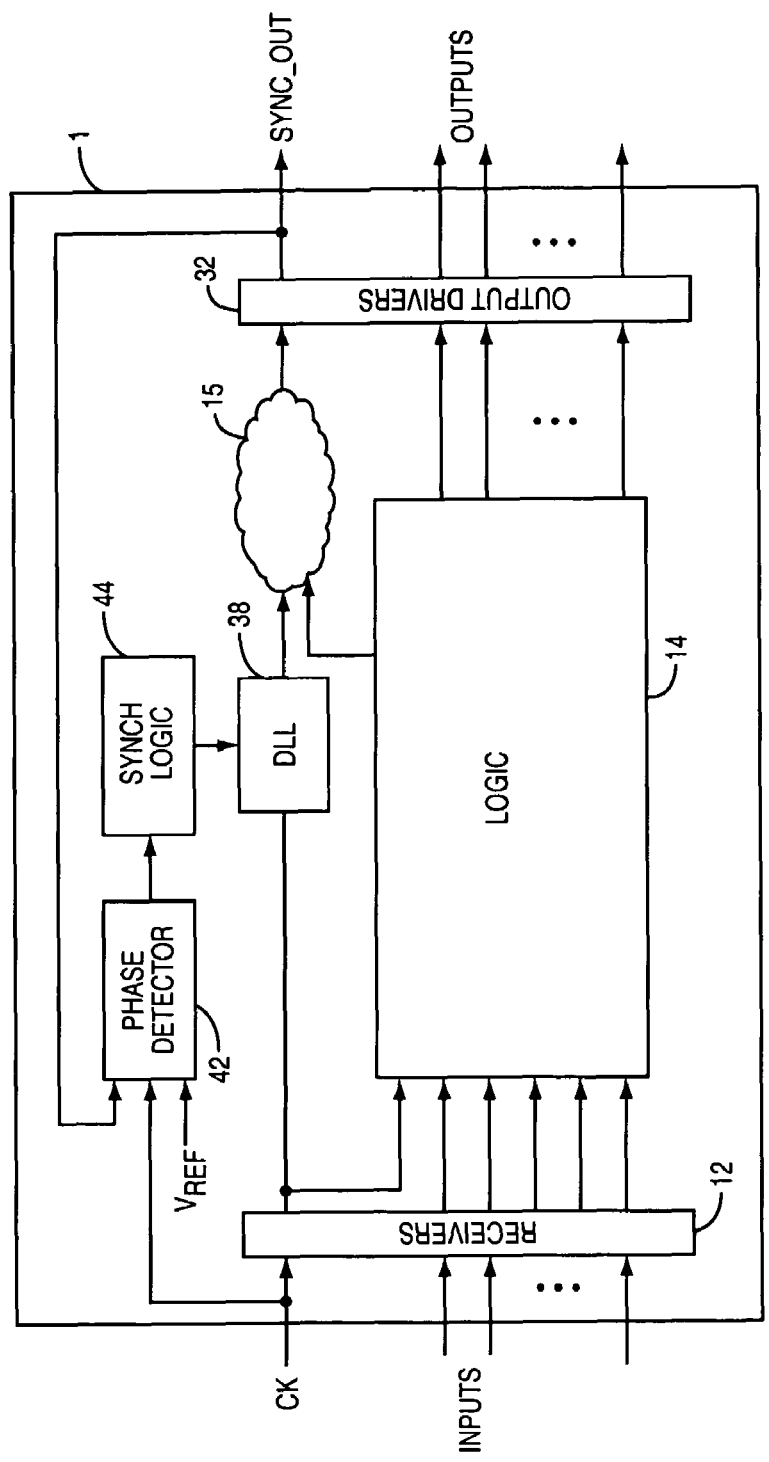
FIG. 1 is a functional block diagram of one embodiment of an integrated circuit component.

The present invention relates to a system and method of the reducing the phase skew between a synchronous output signal generated by an integrated circuit (IC) component and the clock signal applied to the component. FIG. 1 depicts a representative IC component 1. The IC component 1 may comprise any analog, digital, or mixed-signal circuit that has some synchronous component. By way of non-limiting example, the IC component 1 may comprise a processor, digital signal processor (DSP), graphics processor, network/communications controller, peripheral controller, real-time clock (RTC), video or audio processor, compression engine, encryption processor, synchronous dynamic random access memory (SDRAM), double data rate (DDR) SDRAM, or any gate array, ASIC, or full custom IC component 1.

The IC component 1 receives a variety of inputs and generates a variety of outputs via logic block 14. Logic block 14 may include any combination of synchronous or non-synchronous, analog or digital logic. The IC component 1 also receives a clock input CK. The IC component 1 generates a synchronous output signal SYNC_OUT. SYNCH_OUT may be generated from the internal CK signal, combined with signals from the logic block 14, such as in a logic circuit 15.

For high performance operation, it is desired that the transition edges of the synchronous output SYNC_OUT be coincident and in phase with CK edges. In practice, such synchronization is difficult to achieve, due to the variability of delay in receivers 12, logic 15, and output drivers 32. According to one or more embodiments disclosed herein, an inventive circuit, comprising a phase detector 42 and synchronization logic 44, operates on a delay locked loop 38 to synchronize the external SYNC_OUT signal to the external CK input. This synchronization circuit and its method of operation is widely applicable to synchronize any external synchronous signal of the IC component 1 to any periodic, or clock, input signal.

In one representative embodiment of the present invention, the logic block 14 of the IC component 1 comprises a SDRAM or DDR SDRAM, and the synchronous output signal is, e.g., the data strobe signal (DQS) during read operations. However, the inventive circuit and method may be applied to any synchronous output of the SDRAM, including the data bits.

Figure 2:
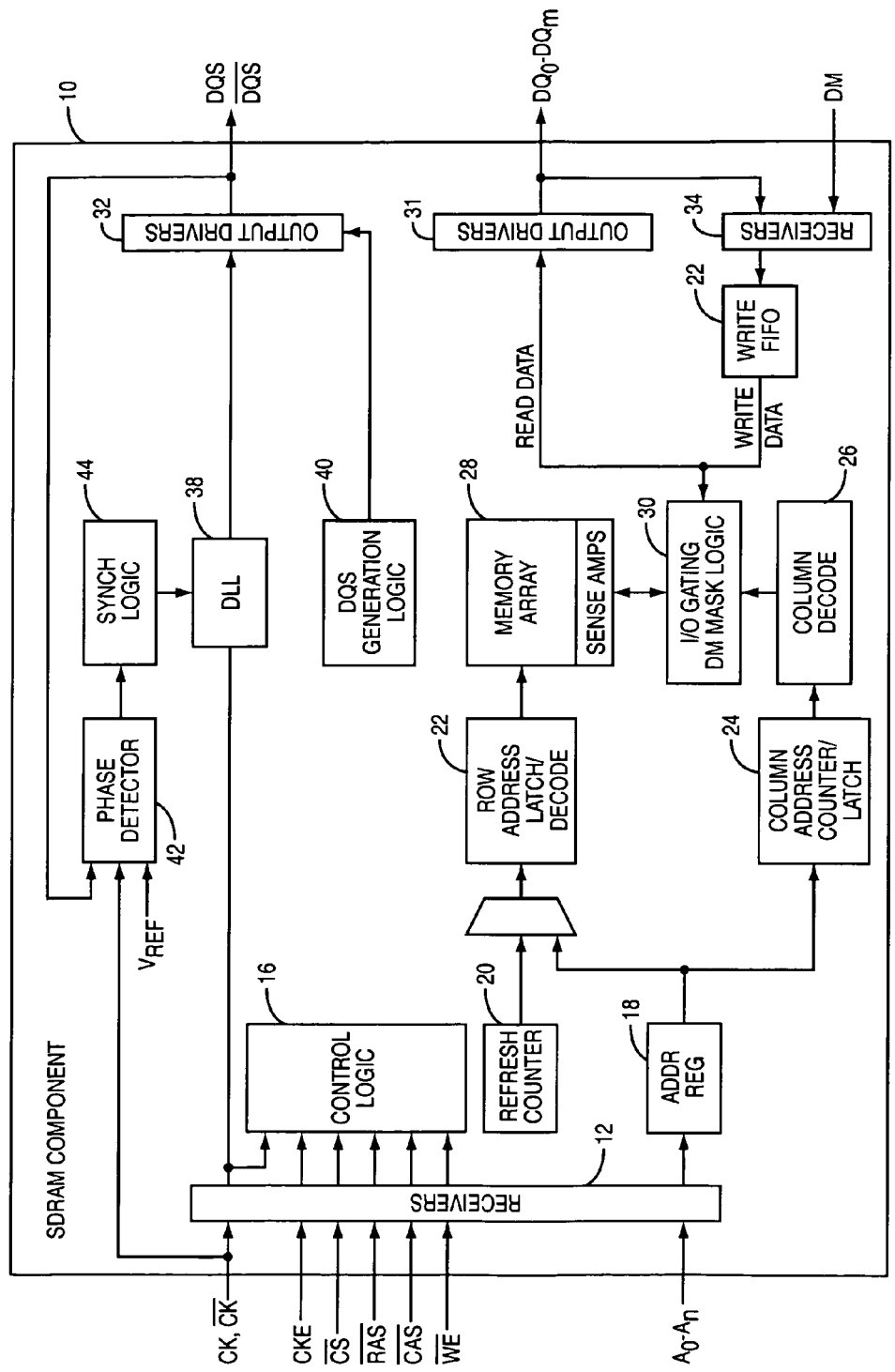
FIG. 2 is a functional block diagram of one embodiment of a SDRAM component.

FIG. 2 depicts a functional block diagram of one embodiment of a SDRAM component 10 configured for improved synchronization of one or more output signals to an applied clock signal. The SDRAM 10 receives differential clock signals (CK, $\overline{CK}$); control signals CKE, $\overline{CS}$, $\overline{RAS}$, $\overline{CAS}$, and $\overline{WE}$; and address bits $A_0$-$A_n$ at receivers, or input buffers, 12. The CK, $\overline{CK}$ signals are distributed across the SDRAM, and drive one or more Delay Locked Loop (DLL) circuits 38 to reduce clock skew. The control signals are inputs to the control logic 16, which generates control signals (not shown) for other functional blocks of the SDRAM 10.

The address bits are latched in address registers 18. Row addresses are multiplexed with the output of a refresh counter 20, and the mux output is directed to a row address latch/decode circuit 22. Column addresses are latched in the column address counter/latch circuit 24, and decoded at circuit 26. The row and column addresses index a memory array 28 and I/O gating circuit 30, as well known in the art. The memory array 28 and associated row and column circuits 22, 24 may be organized in one or more banks, selected by bank select inputs. Read data is driven off-chip as $DQ_0$-$DQ_m$ by output drivers 31, and write data is received on the data bus at receivers or input buffers 34. Write data may be buffered in a FIFO 22 prior to being stored in the memory array 28. Memory storage and retrieval operations of the SDRAM component 10 are well known in the art, and are not further explicated herein.

Differential DQS signals are generated by DQS generation logic 40, and logically gated with differential CK signals in the output drivers 32. The skew of the DQS output with respect to the CK signal is reduced by a Delay Locked Loop (DLL) 38. The DLL 38 includes a feedback delay that simulates the delay of CK receivers 12 and DQS drivers 32, to reduce phase skew between the external DQS and CK signals. According to one or more embodiments of the present invention, the feedback delay is fine-tuned to accurately model the delay of, e.g., CK receiver 12 and DQS driver 32 by synchronization logic 44, in response to the output of a phase detector 42. The inputs to the phase detector 42 are the external differential CK and DQS signals—that is, the CK signals prior to the receivers 12 and the DQS signals after the drivers 32. The phase detector 42 additionally receives a reference voltage input $V_{REF}$.

Figure 3:
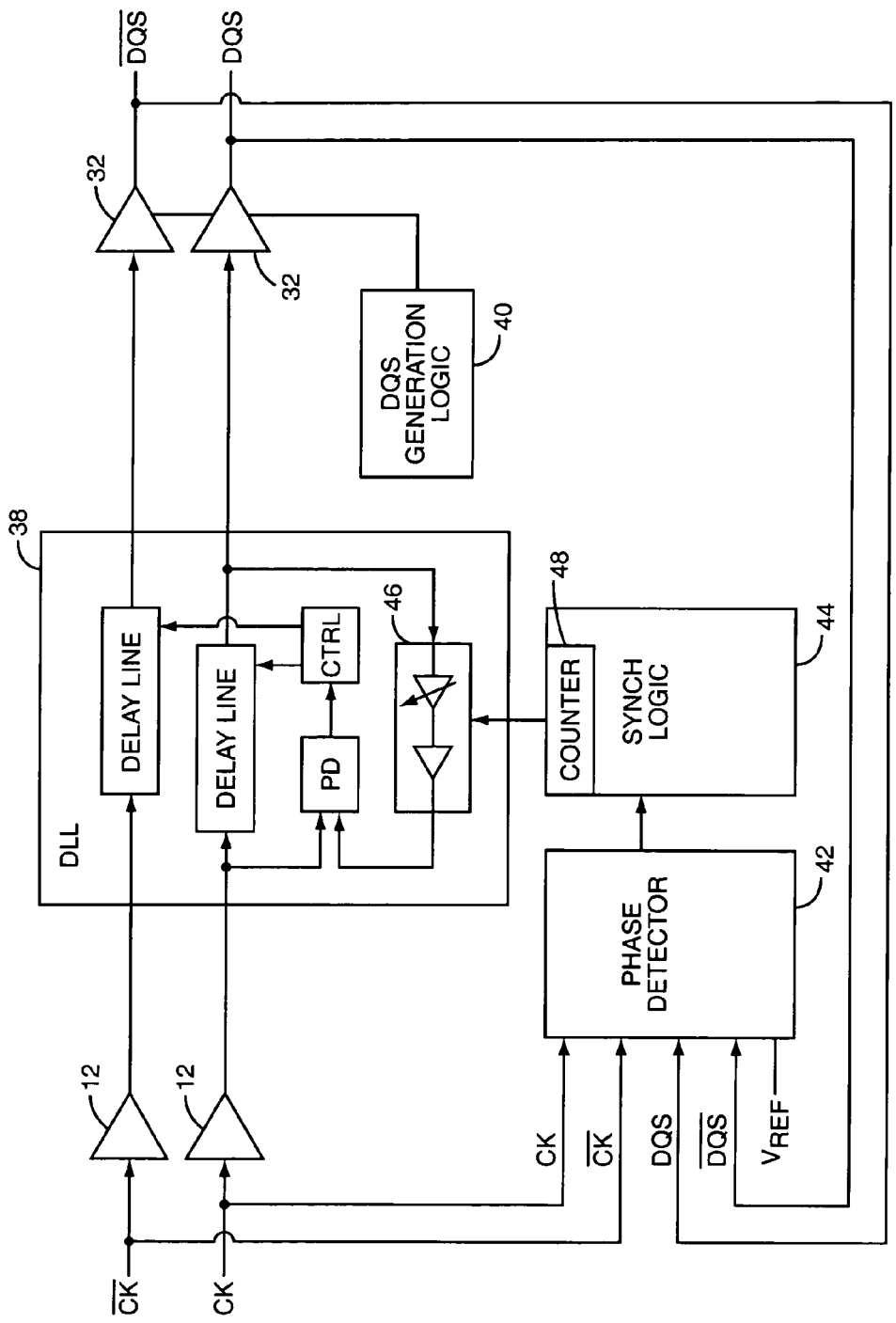
FIG. 3 is a functional block diagram of one embodiment of a synchronization circuit.

Operation of the phase detector 42 and synchronization logic 44 is explained with reference to FIG. 3. The DLL 38 operates to reduce the phase skew between signals at its input and output. To account for buffer delay, the DLL 38 includes a feedback delay 46 having fixed and variable delay components. In one embodiment, the delay of the variable delay component may be altered via a control input from synchronization logic 44, which may for example comprise the output of a counter 48. In another embodiment, the delay of the variable delay component is altered by blowing fuses associated with delay elements in the feedback delay 46. In still another embodiment, the delay of the variable delay component may be altered in either manner.

After the DLL locks, the phase detector 42 compares the relative phase positions of the crossing points of the differential CK and DQS signals, and outputs a single-bit value indicating the relative phase order, or which signal leads the other. That is, the phase detector 42 determines if the crossing point of the differential CK signals occurs sooner or later than the crossing point of the differential DQS signals. In at least one embodiment, the phase detector 42 does not provide any information as to the magnitude or amount of the CK/DQS phase skew, only the relative phase order—that is, an indication of which signal leads the other. In some embodiments, the DQS signal does not comprise a differential pair, but rather is a single signal. In these embodiments, the point at which the single DQS signal crosses the reference voltage $V_{REF}$ is compared to the crossing point of the differential CK signals. $V_{REF}$ may, for example, be set to the midpoint of the voltage swing between low and high values of the DQS signal.

The synchronization logic 44 incrementally alters the feedback delay 46. By normal operation of the DLL 38, this alters the relative phase positions of the external CK and DQS signals. If the change is insufficient to swap the relative phase order of the two signals, the output of the phase detector 42 remains unchanged, and the synchronization logic 44 causes another incremental change in the value of the feedback delay 46. When the resulting change in the relative phase positions of the signals results in a swap in the relative phase order (i.e., a swap in which signal leads the other), the output of the phase detector 42 toggles. At this point, the synchronization logic 44 ceases to incrementally change the feedback delay 46.

In one embodiment, the change to the feedback delay 46 occurs during a manufacturing test in which one or more parameters of the SDRAM component are altered, such as by blowing fuses. In this embodiment, the synchronization logic 44 alters the value of the feedback delay 46 by directing (or allowing) a tester to blow one or more fuses associated with delay elements in the feedback delay 46. In this embodiment, when the phase detector 42 indicates a change in the relative phase order of the CK and DQS signals, the synchronization logic 44 indicates to the tester that the target value of the feedback delay 46 has been reached, and no more fuses should be blown.

In another embodiment, the synchronization logic 44 controls the feedback delay 46 by a value supplied to a control input of the feedback delay 46. In this embodiment, the synchronization logic 44 may incrementally alter the feedback delay 46 by incrementing or decrementing a counter 48, the output of which is the control input to the feedback delay 46. In this embodiment, when the phase detector 42 indicates a change in the relative phase order of the CK and DQS signals, the synchronization logic 44 ceases to increment/decrement the counter 48, and may save the value of the counter 48 or may transfer the value of the counter 48 to a tester, where it is associated with the particular SDRAM component and is stored. In this embodiment, the stored value of the control input to the feedback delay 46 is retrieved during a manufacturing test in which parameters are adjusted by blowing fuses. The stored control value is mapped to the closest value achievable by blowing fuses, and the corresponding fuse pattern is blown, thus setting the feedback delay 46 at or very close to the value at which the CK and DQS signals swapped their relative phase order. The fuse blowing may occur in the same manufacturing test procedure as the determination and saving of the control value, or it may occur in a separate, subsequent manufacturing test procedure.

In another embodiment, the synchronization logic 44 controls the feedback delay 46 by a value supplied to a control input of the feedback delay 46, as described above. In this embodiment, the synchronization procedure may be performed as required or desired. As one example, the synchronization procedure may be performed every time the SDRAM powers up. After the DLL locks, the synchronization logic 44 incrementally alters the feedback delay 46 (such as by incrementing or decrementing the counter 48) and monitors the relative phase order of the external CK and DQS signals. When a change in the applied control value causes a swap in the relative phase order, the synchronization logic 44 ceases to alter the feedback delay 46, and continues to output the control value associated with the swap in relative phase order. In this embodiment, the feedback delay 46 need not include fused delay elements, and the DQS output need not be synchronized to the CK input by a tester during manufacturing test procedures.

Figure 4A:
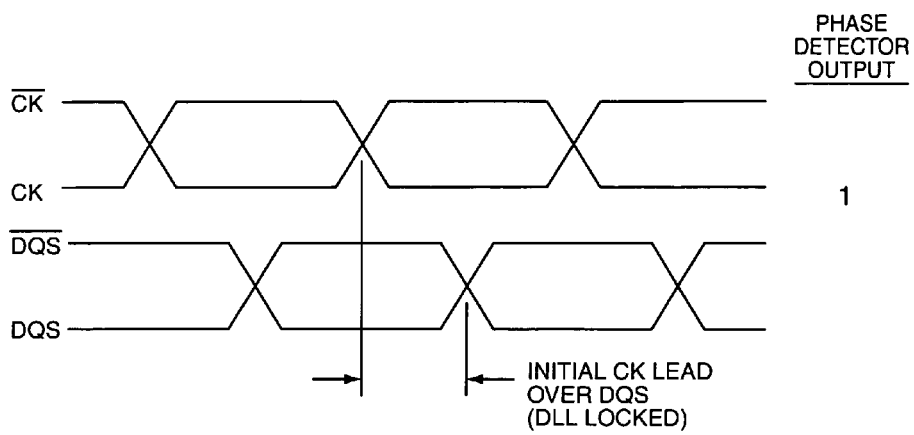
FIG. 4A-4C depicts representative timing diagrams.
Figure 4B:
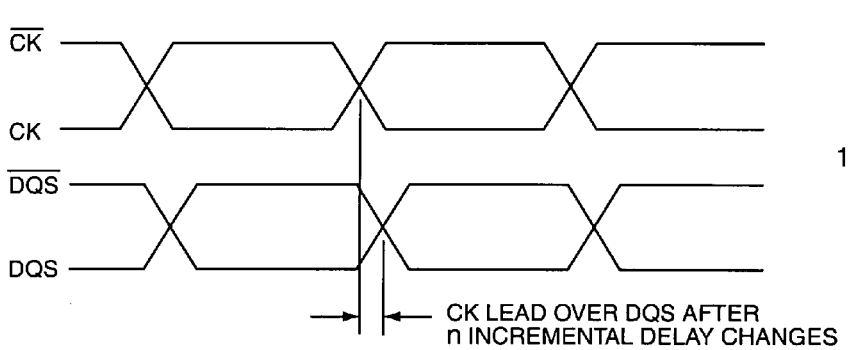
Figure 4C:
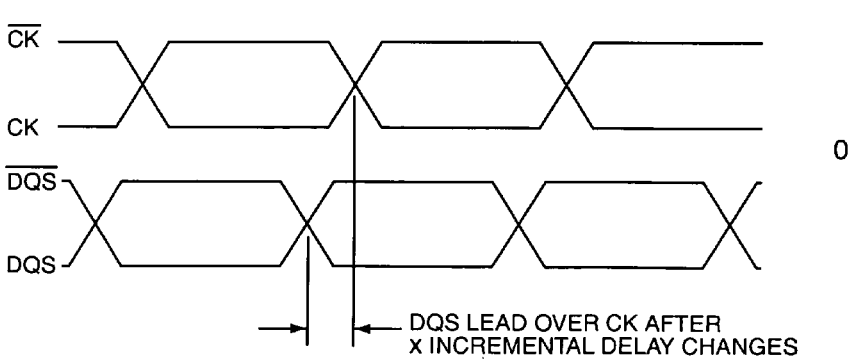

FIGS. 4A-4C depict the phase relationships of the external differential CK and DQS signals, and the output of the phase detector 42. In FIG. 4A, after the DLL 38 has locked but prior to any adjustment of the feedback delay 46, the CK signal leads the DQS signal, as shown. Note that for internal versions of these signals, the DLL 38 will align the signal transition edges. However, the inability of the feedback delay 46 to accurately simulate the delays of the receivers 12 and drivers 32 (due to, e.g., process variation) gives rise to phase skew in the external DQS output, relative to the CK, as depicted in FIG. 4A. The output of the phase detector 42 is a one, indicating that the relative phase order is that (in this example) the differential CK signals lead the differential DQS signals. The state of this output (one or zero) is irrelevant; it is the transition from one state to the other that indicates synchronization.

FIG. 4B depicts the phase skew of the external DQS output relative to the CK input after n cycles of incremental changes to the value of the feedback delay 46 by the synchronization logic 44 (whether via counter 48 or by blowing fuses). Although the signal transition edges are more closely aligned, the CK signal still leads the DQS signal; hence, the output of the phase detector 42 is unchanged.

FIG. 4C depicts the external CK and DQS signals after x cycles of incremental change to the value of the feedback delay 46 by the synchronization logic 44, where x may (but does not necessarily) equal n+1. In this case, the relative phase order has changed. That is, the external DQS output now leads the external CK input, and the output of the phase detector 42 has toggled. In response to the phase detector 42 output, the synchronization logic 44 ceases to incrementally alter the feedback delay 46.

Note that, as depicted in FIGS. 4B and 4C, it is possible that the delay value chosen for the feedback delay 46 may not result in the minimum phase skew of the external DQS output with respect to the external CK input. This is because the synchronization logic 44 is only aware of the relative phase order, not any quantitative information about the relative phase positions. However, with sufficiently small incremental changes in the feedback delay 46, the swap in relative phase position will be very close to perfect synchronization. Additionally, as demonstrated by a comparison of FIGS. 4A and 4C, the alignment achieved by monitoring the swap in phase order results in a more accurate synchronization of the external DQS output to the CK input than does the DLL 38 operating only on internal signals.

Figure 5:
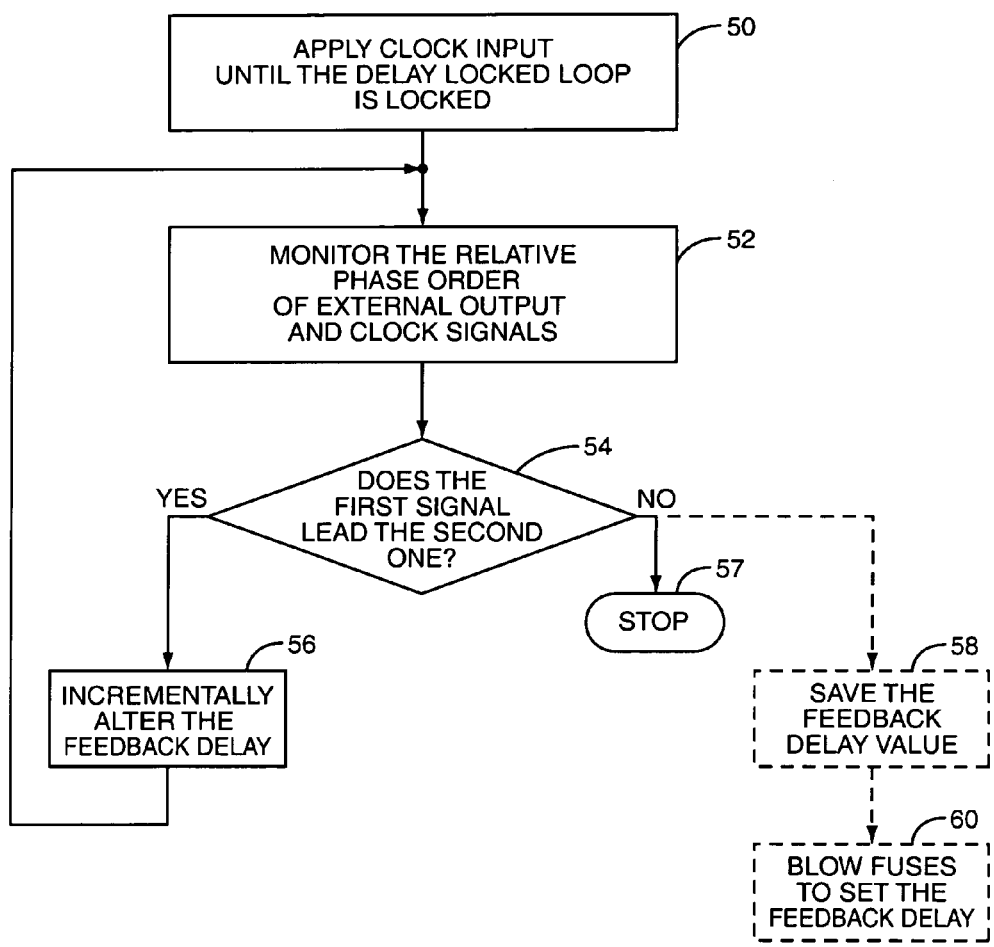
FIG. 5 is a flow diagram of one embodiment of a method of synchronization.

A method of synchronizing an output signal generated by an IC component 1 (such as a SDRAM component 10) to an input clock signal applied to the IC component 1 is described with reference to the flow diagram of FIG. 5. Initially, the clock input is applied to the IC component 1 until the DLL 38 is locked (block 50). The relative phase order of the external clock and output signals is monitored (block 52), such as by inputting the external clock and output signals into a phase detector 42 and monitoring the phase detector 42 output. Initially, a first one of the output and clock signals leads a second one of the output and clock signals (block 54). As long as the first signal leads the second signal (block 54), the value of the feedback delay 46 in the DLL 38 is incrementally altered (block 56), either by blowing fuses in the feedback delay 46 or by outputting control values to the feedback delay 46, such as by incrementing or decrementing a counter 48. By operation of the DLL 38, this changes the relative phase position of the first and second signals. Following the feedback delay alteration (block 56), the relative phase order of the signals is again monitored (block 52).

If the last incremental change in the feedback delay 46 (block 56) results in a swap in the relative phase order of the transition edges—that is, if the second of the signals now leads the first (block 54), then the desired value of the feedback delay 46 has been determined, and in some embodiments the process ends (block 57). For example, if the feedback delay 46 is altered (step 56) by blowing fuses, or if the synchronization method is performed every time the IC component 1 powers up, then when the relative phase order swap is detected (block 54), the synchronization logic 44 simply stops making changes to the feedback delay 46 and the external output signal is synchronized to the external clock input.

In the embodiment wherein the synchronization method occurs in different manufacturing tests, or at different times during the same test, when the relative phase order swap is detected (block 54), the control value output to the feedback delay 46 is saved to a tester (block 58). In this case, the method further includes the step of blowing fuses to set the feedback delay 46 to a value based on the saved control value (block 60).

By monitoring the relative phase order of the an external synchronous output signal and the external applied clock input, and altering the feedback delay 46 of the DLL 38 in response to monitoring these signals, the feedback delay 46 is adjusted to very nearly match the actual delay of the input and output buffers 12, 32 (and possibly other logic 15) in output generation path. This results in very close synchronization of the external output to the clock input, minimizing phase skew and improving high-frequency performance. Although described herein primarily with reference to a SDRAM component 10 and the DQS signal, the systems and methods of the various embodiments of the present invention may be advantageously employed to improve synchronization of any synchronous output of any IC component 1. In particular, the read data outputs DQ of the SDRAM component 10 may be synchronized to the CK signal using the systems and methods disclosed herein, minimizing $t_{AC}$.

By placing the phase detector 42 and synchronization logic 44 on each IC component 1, the synchronization of output signals to the clock may be optimized independently for each IC component 1 on a wafer. This allows for compensation of process variation between individual IC components 1. In the case where the synchronization logic 44 alters the feedback delay 46 by outputting control values, the manufacturing tests may be avoided, and the synchronization procedure performed as required or desired, such as every time the IC component 1 is powered up (once the DLL locks).

As used herein, phase skew and relative phase position refer to the degree to which the transition edges of one periodic signal lead or lag the transition edges of another periodic signal of the same frequency or an integer multiple thereof. The transition edges are defined as the crossing point of differential signals, or the crossing point of a single signal and an applied reference voltage level. As used herein, relative phase order refers to which of two periodic signals leads the other (i.e., its transition edges occur prior to those of the other signal), without regard to the degree of lead. As used herein, an external signal refers to an input signal at the input of the first receiving buffer, or an output signal at the output of the final off-chip driving buffer. As used herein, an internal signal refers to an input signal at or past the output of the first receiving buffer, or an output signal at or prior to the input of the final off-chip driving buffer. As used herein, SDRAM includes DDR SDRAM. As used herein, incrementally altering a value refers to causing a small positive or negative change in the value, such as by either incrementing or decrementing a counter.

Although the present invention has been described herein with respect to particular features, aspects and embodiments thereof, it will be apparent that numerous variations, modifications, and other embodiments are possible within the broad scope of the present invention, and accordingly, all variations, modifications and embodiments are to be regarded as being within the scope of the invention. The present embodiments are therefore to be construed in all aspects as illustrative and not restrictive and all changes coming within the meaning and equivalency range of the appended claims are intended to be embraced therein.

What is claimed is:

1. A method of synchronizing an output signal generated by an integrated circuit (IC) component to a clock signal applied to the component, comprising:
   incrementally altering a variable feedback delay in the IC component to alter the phase skew between the clock signal and the output signal;
   monitoring in the IC component the relative phase order of the clock and output signals; and
   ceasing to alter the variable feedback delay in response to detecting a swap in the relative phase order of the clock and output signals.

2. The method of claim 1 wherein incrementally altering the variable feedback delay comprises blowing one or more fuses in the IC component associated with delay elements in the variable feedback delay.

3. The method of claim 1 wherein incrementally altering the variable feedback delay comprises sequentially applying different control values to the variable feedback delay.

4. The method of claim 3 wherein incrementally applying different control values to the variable feedback delay comprises incrementing or decrementing a counter.

5. The method of claim 3 further comprising
   outputting the variable feedback delay control value corresponding to the swap in the relative phase order of the clock and output signals to a tester; and
   subsequently blowing one or more fuses associated with delay elements in the variable feedback delay based on the saved variable feedback delay control value.

6. The method of claim 1 wherein incrementally monitoring in the IC component the relative phase order of the clock and output signals comprises monitoring in the IC component the relative phase order of the clock and output signals after the Delay Locked Loop locks to the clock signal.

7. The method of claim 1 wherein the IC component is a SDRAM component.

8. An integrated circuit (IC) component, comprising:
   a Delay Locked Loop (DLL) circuit operative to synchronize internal clock signals to an applied external clock input;
   a signal generation circuit connected to the DLL circuit and operative to generate an output signal synchronous with the external clock input;
   a monitoring circuit operative to detect the relative phase order between the output signal and the clock input; and
   a control circuit operative to alter a variable feedback delay of the DLL circuit until the monitoring circuit indicates a swap in the relative phase order between the output signal and the clock input.

9. The IC component of claim 8 wherein the control circuit alters the variable feedback delay by directing a tester to blow one or more fuses associated with delay elements in DLL.

10. The IC component of claim 8 wherein the control circuit alters the variable feedback delay by incrementing or decrementing a counter outputting a control value to the variable delay.

11. The IC component of claim 10 wherein the control circuit saves the value of the counter associated with the swap in the relative phase order between the output signal and the clock signal.

12. The IC component of claim 10 wherein the IC component is a SDRAM component.

13. An integrated circuit (IC) component, comprising:
   an input buffer to receive an applied clock signal;
   an output buffer to drive a synchronous output signal;
   a signal generation circuit operative to generate the synchronous output signal;
   a Delay Locked Loop including a variable feedback delay, the delay of which alters the phase skew between the clock and output signals;
   a phase detector receiving the clock signal prior to the input buffer and receiving the output signal after the output buffer, and outputting a signal indicative of the relative phase order of the clock and output signals; and
   synchronization logic operative to incrementally alter the variable feedback delay, and to synchronize the clock and output signals by ceasing to alter the variable feedback delay when the phase detector output indicates a swap in the relative phase order of the clock and output signals.

14. The IC component of claim 13 wherein the synchronization logic incrementally alters the variable feedback delay by signaling a tester to blow one or more fuses associated with delay elements in the variable feedback delay.

15. The IC component of claim 13 wherein the value of the variable feedback delay varies according to an applied control value, and wherein the synchronization logic incrementally alters the variable feedback delay by successively outputting different control values to the variable feedback delay.

16. The IC component of claim 15 wherein the synchronization logic saves to a tester the control value corresponding to the swap in the relative phase order of the clock and output signals.

17. The IC component of claim 16 wherein the tester subsequently blows fuses in the variable feedback delay based on the saved variable feedback delay control value.

18. The IC component of claim 13 wherein the IC component is a SDRAM component.

19. A method of manufacturing integrated circuit (IC) components, comprising:

for each individual IC component on a wafer, synchronizing an output signal to an applied clock input signal by determining a value for a variable feedback delay in a Delay Locked Loop in the IC component that substantially phase aligns the clock and output signals; and blowing one or more fuses on the IC component to set the variable feedback delay to the determined value.

20. The method of claim 19, wherein the steps of determining a variable feedback delay value and blowing one or more fuses are performed during separate test procedures.

21. The method of claim 20, further comprising storing the determined variable feedback delay value for each IC component and associating the value with the respective IC component.

22. The method of claim 19, wherein the steps of determining a feedback delay value and blowing one or more fuses are performed during the same test procedure.

23. The method of claim 19 wherein the IC component is a SDRAM component.

24. An integrated circuit (IC) component, comprising:

input buffering means for receiving an applied clock signal;

output buffering means for driving a synchronous output signal;

a Delay Locked Loop including a variable feedback delay, the delay of which alters the phase skew between the clock and output signals;

phase detecting means receiving the clock signal prior to the input buffer and receiving the output signal after the output buffer, for determining the relative phase order of the clock and output signals; and synchronizing means for incrementally altering the variable feedback delay, and for synchronizing the clock and output signals by ceasing to alter the variable feedback delay when the phase detecting means detects a swap in the relative phase order of the clock and output signals.

25. The IC component of claim 24 wherein the synchronizing means incrementally alters the variable feedback delay by directing test equipment to blow one or more fuses associated with delay elements in the feedback delay.

26. The IC component of claim 24 wherein the synchronizing means incrementally alters the variable feedback delay by outputting successive control values to the variable feedback delay.

27. The IC component of claim 24 wherein the IC component is a SDRAM component.

* * * * *